(12) United States Patent
Teyssier (10) Patent No.: US 11,255,900 B2
(45) Date of Patent: Feb. 22, 2022

(54) SYSTEM AND METHOD FOR MEASURING REPETITIVE COMPLEX AND PULSE MODULATED RF SIGNALS

(71) Applicant: Keysight Technologies, Inc., Santa Rosa, CA (US)

(72) Inventor: Jean-Pierre Teyssier, Santa Rosa, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 17/006,038

(22) Filed: Aug. 28, 2020

(65) Prior Publication Data

US 2021/0132141 A1    May 6, 2021

Related U.S. Application Data

(60) Provisional application No. 62/928,104, filed on Oct. 30, 2019.

(51) Int. Cl.
  *G01R 31/28* (2006.01)
  *H04B 17/00* (2015.01)
  *H04B 17/11* (2015.01)
  *H04B 17/29* (2015.01)

(52) U.S. Cl.
  CPC ..... *G01R 31/2822* (2013.01); *H04B 17/0085* (2013.01); *H04B 17/11* (2015.01); *H04B 17/29* (2015.01)

(58) Field of Classification Search
  CPC .... H04B 17/11; H04B 17/29; H04B 17/0085; G01R 31/2822
  See application file for complete search history.

(56) References Cited

U.S. PATENT DOCUMENTS

| 6,335,701 B1 * | 1/2002 | Fujisaka ............. G01S 7/288 |
| | | 342/115 |
| 8,891,639 B2 | 11/2014 | Vanden Bossche |
| 9,887,785 B1 | 2/2018 | Anderson et al. |
| 9,954,546 B2 | 4/2018 | Laquai |
| 10,135,541 B1 | 11/2018 | Sahmee et al. |

(Continued)

OTHER PUBLICATIONS

J.P. Teyssier et al.,"Large-Signal Time Domain Characterization of Microwave Transistors under RF Pulsed Conditions," I57th ARFTG Conference Digest, Phoenix, AZ, USA, 2001, pp. 1-4.

(Continued)

*Primary Examiner* — Dominic E Rego (57) ABSTRACT

A method for measuring modulated radio frequency (RF) signals from a device under test (DUT) includes inputting a test RF signal to the DUT, where the test RF signal is modulated with a repetitive complex waveform and a pulsed waveform, the repetitive complex waveform including multiple RF tones with an RF tone spacing and an RF repetition period, where a pulse width of the pulsed waveform is less than the RF repetition period; acquiring an output RF signal from the DUT responsive to the input test RF signal; down converting the output RF signal to an intermediate frequency (IF) signal; sampling the IF signal using an analog to digital converter (ADC) having an ADC clock frequency; measuring ADC samples of the IF signal; and reconstructing the test RF signal modulated with the repetitive complex waveform using the measured ADC samples.

18 Claims, 3 Drawing Sheets

(56) References Cited

U.S. PATENT DOCUMENTS

| | | | | |
|---|---|---|---|---|
| 2003/0057964 A1* | 3/2003 | Verspecht | .......... | G01R 31/2822 |
| | | | | 324/603 |
| 2004/0156430 A1* | 8/2004 | Lobo | .................. | G01R 31/2822 |
| | | | | 375/224 |
| 2008/0230624 A1* | 9/2008 | Giles | .................... | F16K 31/0655 |
| | | | | 239/69 |
| 2009/0204357 A1* | 8/2009 | Kurosawa | ............. | G06F 1/0342 |
| | | | | 702/124 |
| 2011/0057665 A1* | 3/2011 | Watanabe | ........... | H04L 27/0008 |
| | | | | 324/537 |
| 2017/0118569 A1* | 4/2017 | Quan | .................... | H04R 29/004 |
| 2019/0229694 A1* | 7/2019 | Quan | ..................... | H04R 29/00 |
| 2019/0363917 A1* | 11/2019 | Iwai | .................... | H04L 27/3405 |
| 2020/0103485 A1* | 4/2020 | Anderson | ............... | G01R 35/00 |

OTHER PUBLICATIONS

Jad Faraj et al., "Bursts of Pulses for Time Domain Large Signal Measurements," ARFTG Spring 2009 Conference 2009 International Microwave Symposium—Boston, pp. 1-5.

Michele Squillante et al., "Application Note 5A.046," Maury Microwave Corporation. Jun. 2010, pp. 1-6.

Fabien De Groote, et al., "Pulsed Multi-Tone Measurements for Time Domain Load Pull Characterizations of Power Transistors," IEEE Microwave Measurement Conference, 2009, pp. 1-4.

\* cited by examiner

SYSTEM AND METHOD FOR MEASURING REPETITIVE COMPLEX AND PULSE MODULATED RF SIGNALS

CROSS-REFERENCE TO RELATED APPLICATION

The present application claims priority under 35 U.S.C. § 119(e) to U.S. Provisional Application No. 62/928,104 filed on Oct. 30, 2019. The entire disclosure of U.S. Provisional Application No. 62/928,104 is specifically incorporated herein by reference in its entirety.

BACKGROUND

A device under test (DUT), such as various components of a wireless communications device, may be characterized by stimulating it with a repetitive complex modulated radio frequency (RF) signal, which is also pulse modulated, and measuring a resulting output RF signal. The measurements of the output RF signal may be used to determine various parameters of the DUT, such as gain, delay and distortion, for example. The measurements are made using a test instrument, such as a vector network analyzers (VNA) or spectrum analyzers (SA), which incorporates a superheterodyne receiver. Generally, the superheterodyne receiver acquires the output RF signal, down converts the output RF signal to a lower frequency intermediate frequency (IF) signal, and digitizes the IF signal before measuring the DUT parameters. The IF signal may be digitized using an analog to digital converter (ADC), which samples the IF signal at a lower rate than the modulation.

Conventionally, in order to perform measurements, a pulse width of the pulse modulation must be greater than a repetition period of the repetitive complex modulated RF signal. This is because, when the pulse width is less than the repetition period, the RF signal is chopped up, making it difficult to reconstruct and measure the complex modulation.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to" or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

Figure 1:
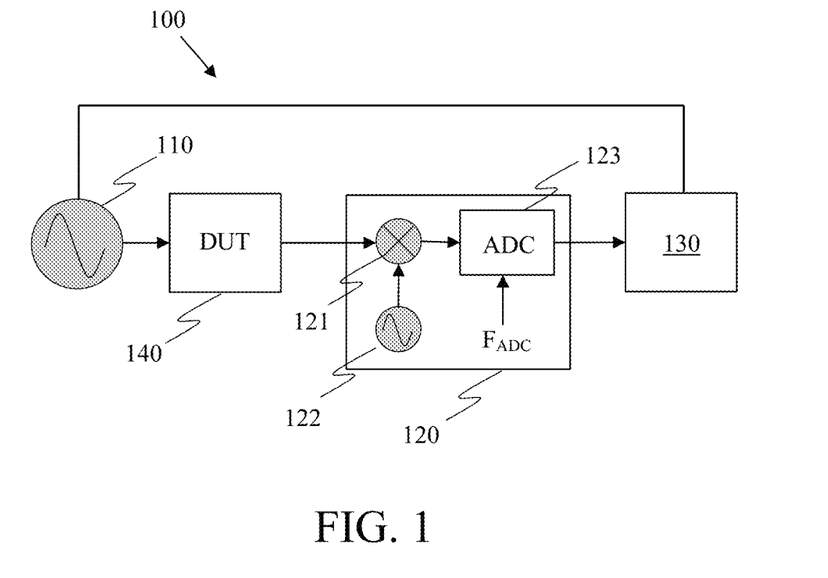
FIG. 1 is a simplified block diagram of a test system for measuring parameters of a device under test (DUT) using a repetitive complex and pulse modulated test radio frequency (RF) signal, according to a representative embodiment.

FIG. 1 is a simplified block diagram of a test system for measuring parameters of a DUT using a repetitive complex modulated RF signal, which is also pulse modulated (referred to as "complex and pulse modulated test RF signal" or "test RF signal"), according to a representative embodiment.

Referring to FIG. 1, test system 100 includes an RF signal source 110, an RF receiver 120 and a processing unit 130 configured for testing a DUT 140. The RF receiver 120 may be included in a test instrument, such as a vector network analyzer (VNA) or spectrum analyzer (SA), for example, or any other test equipment used for measuring modulated RF signals. The RF signal source 110 and/or the processing unit 130 may also be included in the test instrument along with the RF receiver 120, or may be implemented as separate devices that function in cooperation with the test instrument. The DUT 140 may be any type of electronic device, such as an amplifier, a mixer or a converter, for example, that provides an output RF signal in response to a test RF signal (stimulus signal) input by the RF signal source 110 to the DUT 140.

The RF signal source 110 and the RF receiver 120 may be configured by and/or operated under control of the processing unit 130. For example, the processing unit 130 may be programed to perform all or part of the steps discussed below with reference to FIG. 4. In various embodiments, the processing unit 130 may be implemented using one or more processors, such as a digital signal processor (DSP) and/or a computer processor (collectively "processor(s)"), application specific integrated circuits (ASICs), field-programmable gate arrays (FPGAs), or combinations thereof, using software, firmware, hard-wired logic circuits, or combinations thereof. Processor(s), in particular, may be constructed of any combination of hardware, firmware or software architectures, and may include their own memory for storing executable software/firmware or code that allows performance the various functions. In an embodiment, the processor(s) may comprise a central processing unit (CPU), for example, executing an operating system.

Memory (not shown) may be provided in or with the processing unit 130 in order to store software, code and/or programs executable by the processor(s), as well as data, such as measurement data, collected from the DUT 140 and the RF receiver 120, as well as other sources of information. The memory may be implemented by any number, type and combination of random access memory (RAM) and read-only memory (ROM), for example, and may store various types of information, such as computer programs and software algorithms executable by the processor(s) (and/or other components), as well as raw data and/or testing and measurement data storage, for example. The various types of ROM and RAM may include any number, type and combination of computer readable storage media, such as a disk drive, electrically programmable read-only memory (EPROM), electrically erasable and programmable read only memory (EEPROM), a compact disk (CD), a digital versatile disk (DVD), a universal serial bus (USB) drive, registers, a blu-ray disk, and the like, which are tangible and non-transitory storage media (e.g., as compared to transitory propagating signals).

The RF signal source 110 is configured to generate the complex and pulse modulated test RF signal that is applied to the DUT 140. The RF signal source 110 may be a vector signal generator, for example. In particular, the RF signal source 110 modulates an RF signal with a repetitive complex waveform and a pulsed waveform to provide the complex and pulse modulated test RF signal. Because the complex modulation is repetitive in the time domain, the test RF signal will include multiple RF tones in the frequency domain. The pulsed waveform of the test RF signal includes a series of on-pulses separated by a series of off-pulses over time, where each on-pulse may have a magnitude of one and each off-pulse may have a magnitude of zero. In an embodiment, durations of the on-pulses are shorter than durations of a repetition period of the repetitive complex modulation.

Figure 2A:
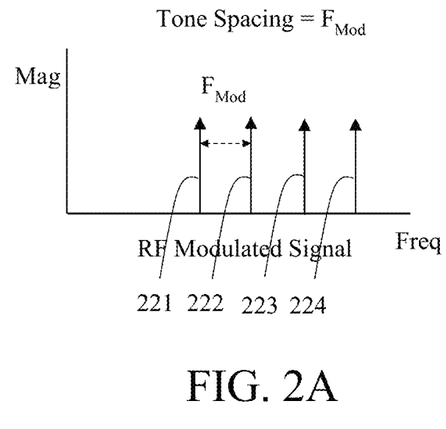
FIG. 2A is a graph showing magnitude of a test RF signal versus frequency, according to a representative embodiment.
Figure 2B:
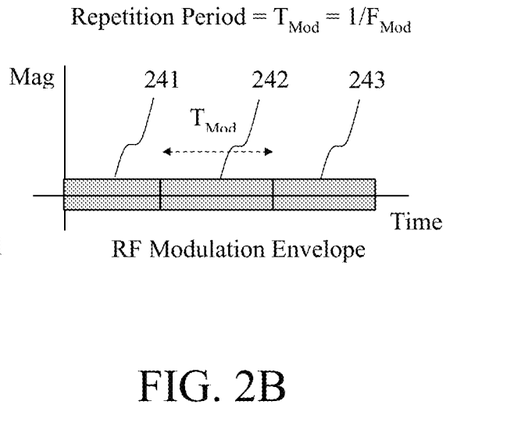
FIG. 2B is a graph showing magnitude of an RF modulation envelope of the test RF signal versus time, according to a representative embodiment.

As shown in FIGS. 2A and 2B, the repetitive complex waveform modulating the test RF signal has an RF tone spacing ($F_{Mod}$) and an RF repetition period ($T_{Mod}$). In particular, FIG. 2A is a graph showing magnitude of the test RF signal, plotted in the frequency domain, where the test RF signal includes representative RF tones 221, 222, 223 and 224 that are separated from one another by the RF tone spacing $F_{Mod}$. FIG. 2B is a graph showing magnitude of the test RF signal, plotted in the time domain, where the RF modulation envelope of the test RF signal includes representative RF repetition periods $T_{Mod}$ 241, 242 and 243. The RF repetition period $T_{Mod}$ is equal to the inverse of the RF tone spacing ($1/F_{Mod}$). Also, pulse widths of the on-pulses of the pulsed waveform are shorter in duration than the RF repetition periods $T_{Mod}$ 241, 242 and 243 of the repetitive complex modulated waveform.

The test RF signal is input to the DUT 140 as a stimulus signal, in response to which the DUT 140 provides a repetitive complex and pulse modulated output RF signal. The output RF signal is modulated with the same repetitive complex waveform, having the RF tone spacing $F_{Mod}$ in the frequency domain and the RF repetition period $T_{Mod}$ in the time domain, and the same pulsed waveform as the test RF signal. The output RF signal is acquired by the RF receiver 120, which includes a mixer 121, an LO 122 and an analog to digital converter (ADC) 123. The LO 122 generates an LO signal at an LO frequency that is mixed with the output RF signal by the mixer 121 to down convert the complex and pulse modulated output RF signal to an intermediate frequency (IF) signal. The IF signal is similarly complex and pulse modulated, having a repetitive complex waveform, which includes multiple IF tones with an IF tone spacing ($F_{IF}$) in the frequency domain and an IF repetition period ($T_{IF}$) in the time domain.

Notably, each on-pulse of the pulsed waveform of the test RF signal, discussed above, is a fraction of the IF repetition period $T_{IF}$ and each off-pulse of the pulsed waveform is approximately an integer multiple of the IF repetition period $T_{IF}$. For example, the on-pulse may have a duration of approximately $T_{IF}/3$, and the off-pulse may have a duration of approximately $2*T_{IF}$, although in practice, the durations of the on-pulses and off-pulses may vary slightly from these ideal values. Other combinations of on-pulse and off-pulse durations may be incorporated, without departing from the scope of the present teachings.

The ADC 123 samples the IF signal output by the mixer 121 according to an ADC clock frequency ($F_{ADC}$). In various implementations, the sampled IF signal may be digitally processed (e.g., by the processing unit 130) to appear as though the IF signal were sampled at a different rate than a fixed ADC clock frequency of the ADC 123, which is referred to as "re-sampling." The embodiments herein may include sampling at the fixed ADC clock frequency or at a re-sampled ADC clock frequency, without departing from the scope of the present teachings. Accordingly, the term ADC clock frequency $F_{ADC}$ as used herein is intended to include both the fixed ADC clock frequency and any re-sampled ADC clock frequencies that may be used.

The modulation of the test RF signal provided by the RF signal source 110 is based on the ADC clock frequency $F_{ADC}$. That is, the RF tone spacing $F_{Mod}$ of the test RF signal (and thus the output RF signal) is selected to equal a first fraction of the ADC clock frequency $F_{ADC}$, where the first fraction may be represented by $F_{ADC}*N/M$ (N and M being positive integers). The complex modulation of the IF signal provided by the mixer 121 is likewise based on the ADC clock frequency $F_{ADC}$ and also the LO frequency of the LO signal. That is, the LO frequency of the LO signal is selected so that the RF tones of the output RF signal are down converted to a grid of frequencies (IF tones) that correspond to harmonics of a second fraction of the ADC clock frequency $F_{ADC}$, where the second fraction of the ADC clock frequency $F_{ADC}$ is $F_{ADC}/M$ (M being a positive integer). This simplifies digital filtering requirements of the digitized IF signal following the ADC 123, and allows the ADC samples to be used as a timing reference for measuring the IF signal. The IF repetition period $T_{IF}$ of the IF signal equals an integer multiple of the RF repetition period $T_{mod}$. That is, the IF repetition period $T_{IF}=N*T_{Mod}=M/F_{ADC}$ (N and M being positive integers). Thus, the IF repetition period TT may be the exact ADC acquisition time required to capture a complete time record of the output RF signal in the time domain, as discussed below.

In an embodiment, when the bandwidth of the test RF signal (and thus the output RF signal) is wider than the IF bandwidth of the RF receiver 120, then multiple output RF signal acquisitions are performed using different LO settings of the LO 122, respectively, to obtain corresponding IF signals. The frequency domain results of the IF signals, measured using time records as described herein, may be stitched together to represent the full output RF signal bandwidth.

Figure 3A:
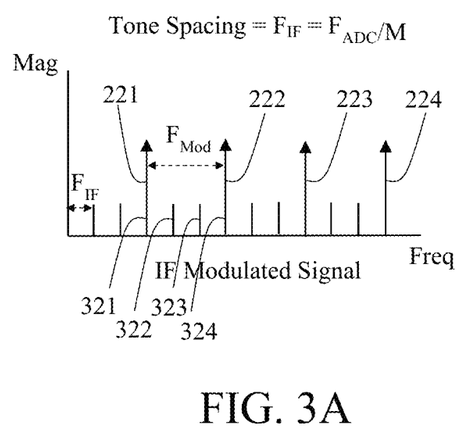
FIG. 3A is a graph showing magnitude of an IF signal versus frequency, according to a representative embodiment.
Figure 3B:
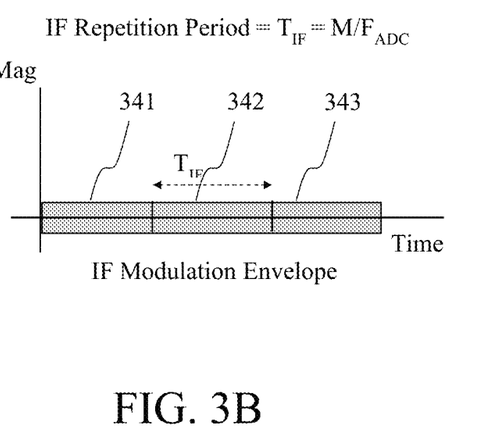
FIG. 3B is a graph showing magnitude of an IF modulation envelope of the IF signal versus time, according to a representative embodiment.

FIG. 3A is a graph showing magnitude of an IF signal, plotted in the frequency domain, according to a representative embodiment, and FIG. 3B is a graph showing magnitude of an IF modulation envelope of the IF signal, plotted in the time domain, according to a representative embodiment.

Referring to FIG. 3A, the IF signal includes representative IF tones 321, 322, 323 and 324 that are consecutively separated from one another by the IF tone spacing $F_{IF}$. The IF tone spacing is based on the ADC clock frequency $F_{ADC}$. That is the IF tone spacing $F_{IF}$ is equal to $F_{ADC}/M$, such that the IF tones correspond to harmonics of $F_{ADC}/M$, and thus harmonics of the RF tone spacing $F_{Mod}$ of the test RF signal, as well. This is apparent in the depicted example of FIG. 3A in that every third IF tone (e.g., IF tones 321 and 324) overlaps with an RF tone (e.g., RF tones 221 and 222), which is the case for example when N=M=3. Referring to FIG. 3B, the IF modulation envelope includes representative IF repetition periods $T_{IF}$ 341, 342 and 343. As mentioned above, each of the IF repetition periods $T_{IF}$ 341, 342 and 343 is equal to $M/F_{ADC}$, which in the depicted example is $3/F_{ADC}$. Of course, other values of M and/or N may be incorporated without departing from the scope of the present teachings.

Figure 4:
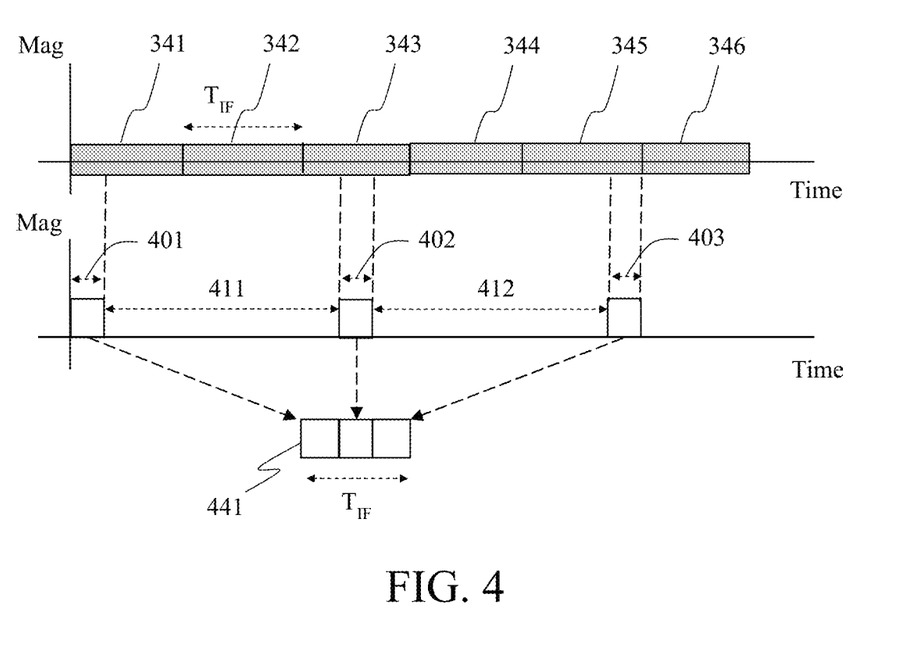
FIG. 4 includes comparison graphs showing magnitude of an IF signal and magnitude of an IF modulation envelope of the IF signal, both plotted in the time domain, according to a representative embodiment.

FIG. 4 includes comparison graphs showing magnitude of an IF signal and magnitude of an IF modulation envelope of the IF signal, both plotted in the time domain, according to a representative embodiment.

Referring to FIG. 4, the test RF signal is pulse modulated by a pulsed waveform that is aligned with the repeating complex modulated IF signal, as indicated by representative IF repetition periods $T_{IF}$ 341, 342, 343, 344, 345 and 346. The representative pulsed waveform includes on-pulses 401, 402 and 403, and off-pulses 411 and 412 separating the on-pulses 401, 402 and 403. The duration (pulse width) of each of the on-pulses is approximately equal to $T_{IF}/L$, and the duration of each of the off-pulses is approximately equal to $T_{IF}*K$ (L and K being positive integers), where the on-pulses are shorter than the off-pulses. That is, the actual durations of the on-pulses 401, 402 and 403 may be slightly longer than the ideal values ($T_{IF}/L$) depicted in FIG. 4, and the actual durations of the off-pulses 411 and 412 may be slightly shorter than the ideal values ($T_{IF}*K$) depicted in FIG. 4, for example. However, the sum of the actual duration of an on-pulse (e.g., on-pulse 401) and an adjacent off-pulse (e.g., off-pulse 411) still equals one period of the pulsed waveform (on-pulse+off-pulse=$T_{IF}/L+T_{IF}*K$). Generally, the on-pulses 401, 402 and 403 being approximately equal to $T_{IF}/L$ means that they have durations within 15 percent of $T_{IF}/L$, and the off-pulses 411 and 412 being approximately equal to $T_{IF}*K$ means that they have durations within 15 percent of $T_{IF}*K$. In the depicted example, L=3 and K=2, such that each of on-pulses 401, 402 and 403 has a duration of approximately $T_{IF}/3$, and each of the off-pulses 411 and 412 has a duration of approximately $T_{IF}*2$. Of course, other combinations of on-pulse and off-pulse durations may be incorporated, without departing from the scope of the present teachings.

The sampling and measurements of the IF signal by the ADC 123 are substantially time aligned with the pulsed waveform initially provided by the RF signal source 110 for pulse modulating the test RF signal, as discussed below. That is, the sampling is performed during measurement periods that substantially correspond to the on-pulses and non-measurement periods that substantially correspond to the off-pulses. The duration of each of the measurement periods is equal to $T_{IF}/L$ and the duration of each of the non-measurement periods is equal to $T_{IF}*K$ (L and K being positive integers). Measurements made by the ADC 123 during the measurement periods (substantially corresponding to the on-pulses 401, 402 and 403) are accumulated, and measurements made by the ADC 123 during the non-measurement periods (substantially corresponding to the off-pulses 411 and 412) are discarded. Alternatively, the ADC 123 may be configured to stop performing measurements during the non-measurement periods, as opposed to performing and discarding the measurements. The measurement periods and non-measurement periods are said to substantially correspond to (or be substantially time aligned with) the on-pulses and off-pulses because the actual durations of the on-pulses and off-pulses of the pulsed waveform may vary from $T_{IF}/L$ and $T_{IF}*K$, respectively, by up to 15 percent, as discussed above. Accordingly, substantially correspond (and substantially time aligned) means that the measurement periods and non-measurement periods are within 15 percent of being time aligned with the on-pulses and off-pulses, respectively.

The accumulated measurements of the ADC samples from L consecutive measurement periods are concatenated together in the time domain to create a complete time record 441 of length $T_{IF}$ (representing one cycle of the IF signal).

Thus, in the depicted example, the time record 441 consists of three (L=3) consecutive sets of measured samples from three consecutive measurement periods, which substantially correspond to the three consecutive on-pulses 401, 402 and 403.

As discussed above, the test RF signal is effectively a combination of a repetitive complex modulated signal and a pulse modulated signal, which do not need to be time aligned. Likewise, the pulsed waveform of the pulse modulated signal and the measurements by the ADC 123 do not need to be time aligned with (and/or triggered by) the repetitive complex modulated signal. However, the pulsed waveform of the pulse modulated signal and the measurements by the ADC 123 do need to be substantially time aligned with one another. Also, the measurements by the ADC 123 included in each time record 441 provide all the timing information needed for reconstructing the repetitive complex modulated waveform of the test RF signal over each of the IF repetition periods $T_{IF}$ in the IF signal. This approach can handle arbitrarily wide RF modulation bandwidths, as it is compatible with frequency domain stitching, as mentioned above.

Figure 5:
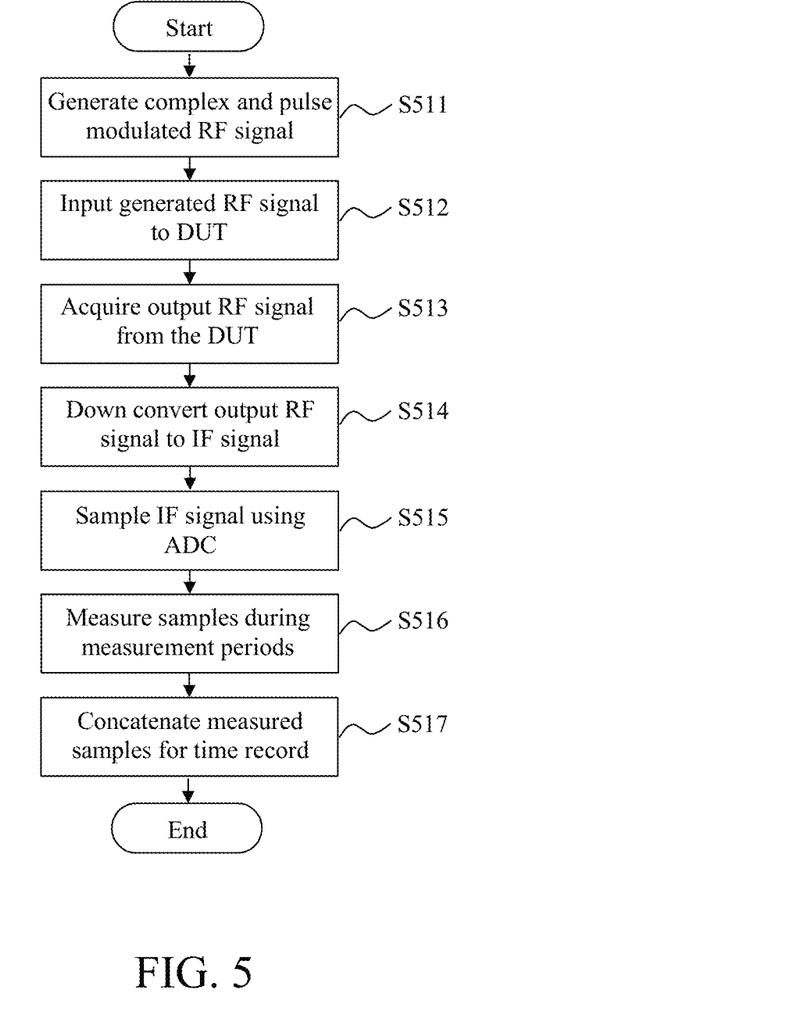
FIG. 5 is a simplified flow diagram showing a method for measuring pulsed modulated RF signals from a DUT, according to a representative embodiment.

FIG. 5 is a simplified flow diagram showing a method for measuring modulated RF signals from a DUT, according to a representative embodiment. All or some of the steps shown in FIG. 5 may be implemented by the processing unit 130. For example, a non-transitory computer readable medium may have stored thereon software instructions that, when executed by processor(s) of the processing unit 130, cause these processor(s) to measure output RF signals from the DUT in accordance with FIG. 5.

Referring to FIG. 5, a test RF signal is generated by a signal source (e.g., RF signal source 110) in block S511, and input to a DUT (e.g., DUT 140) in block S512. The test RF signal is modulated with a repetitive complex waveform and a pulsed waveform. The repetitive complex modulated waveform includes multiple RF tones with an RF tone spacing $F_{Mod}$ in the frequency domain and an RF repetition period $T_{Mod}$ in the time domain. The pulse modulated waveform includes a series of on-pulses separated by a series of off-pulses, the respective lengths of which are determined based anticipated characteristics of an IF signal, discussed below with reference to block S514. Pulse widths of the on-pulses of the pulsed waveform are shorter in duration than the RF repetition period $T_{Mod}$ of the repetitive complex modulated waveform. Also, the RF tone spacing $F_{Mod}$ of the repetitive complex modulated waveform in the test RF signal is determined based on an ADC clock frequency of an ADC used to sample and digitize this IF signal, discussed below with reference to block S515.

In block S513, an output RF signal is acquired from the DUT via an RF receiver (e.g., RF receiver 120). The output RF signal is responsive to the input test RF signal, and characterizes features of the DUT, e.g., for testing purposes. The output RF signal acquired from the DUT is modulated with the same repetitive complex waveform and pulsed waveform as the test RF signal, including the RF tone spacing $F_{Mod}$ and the RF repetition period $T_{Mod}$.

In block S514, the output RF signal is down converted to an IF signal by mixing the output RF signal at a mixer (e.g., mixer 121) with an LO signal provided by an LO (e.g., LO 122). The IF signal is likewise modulated with a repetitive complex waveform that includes multiple IF tones with an IF tone spacing $F_{IF}$ and an IF repetition period $T_{IF}$. As mentioned above, the pulse timing of the pulsed waveform modulating the test RF signal is determined based on the characteristics of the IF signal. In particular, the length of each of the on-pulses of the pulsed waveform is a fraction of the IF repetition period $T_{IF}$, and the length of each of the off-pulses of the pulsed waveform is an integer multiple of the IF repetition period $T_{IF}$. For example, each of the on-pulses may have a length equal to $T_{IF}/L$, and each of the off-pulses mat have a length of $T_{IF}*K$ (L and K being positive integers).

The IF signal is sampled and digitized in block S515 using an ADC (e.g., ADC 123) that has an ADC clock frequency $F_{ADC}$. As mentioned above, the RF tone spacing $F_{Mod}$ of the repetitive complex waveform modulating the test RF signal, as generated by the signal source, is determined based on the ADC clock frequency $F_{ADC}$. In particular, the RF tone spacing $F_{Mod}$ is selected to equal a first fraction of the ADC clock frequency $F_{ADC}$, where the first fraction of the ADC clock frequency $F_{ADC}$ may be represented by N/M (N and M being positive integers). With regard to the IF signal provided in block S514, the IF tone spacing $F_{IF}$ is selected such that the RF tones of the test RF signal provided in block S511 are down converted to the IF tones, such that the IF tones correspond to harmonics of a second fraction of the ADC clock frequency $F_{ADC}$, where the second fraction of the ADC clock frequency $F_{ADC}$ may be represented by $F_{ADC}/M$ (M being a positive integer). Also, the IF repetition period $T_{IF}$ of the IF signal is an integer multiple of the RF repetition period $T_{Mod}$, which may be represented by $N*T_{Mod}$ or $M/F_{ADC}$ (N and M being positive integers).

In block S516, samples of the IF signal measured by the ADC are accumulated only during measurement periods, which substantially correspond to the on-pulses of the pulsed waveform. Measurements made by the ADC during intervening non-measurement periods, which substantially correspond to the off-pulses, are discarded. A predetermined number of the measured samples accumulated from the measurement periods are concatenated in block S517 in order to create time records (e.g., time record 441), respectively. The measured samples in each time record may be accumulated from consecutive measurement periods, substantially corresponding to consecutive on-pulses. Each of the time records is equal in length to the length of the IF repetition period $T_{IF}$ of the IF signal, representing one cycle of the IF signal. For example, as discussed above, each of the measurement periods may have a length equal to $T_{IF}/L$ (L being a positive integer). Therefore, concatenating measurements corresponding to L consecutive measurement periods provides a time record having the length $L*T_{IF}/L$, or simply $T_{IF}$.

Using the time records from block S516, the non-pulsed repetitive complex waveform may be reconstructed, e.g., by the processing unit 130, over each of the IF repetition periods $T_{IF}$ in the IF signal, where the time records provide all of the necessary timing information. Also, as mentioned above, the repetitive complex waveform and the pulsed waveform do not need to be time aligned. Unlike conventional techniques, the method enables measurement of repetitive complex modulated and pulse modulated RF signals that have pulse widths that are shorter than the repetition periods of the complex modulation, thus expanding the types of RF signals that can be measured.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A method for measuring modulated radio frequency (RF) signals from a device under test (DUT), the method comprising:

inputting a test RF signal to the DUT, wherein the test RF signal is modulated with a repetitive complex waveform and a pulsed waveform, the repetitive complex waveform comprising a plurality of RF tones with an RF tone spacing and an RF repetition period, wherein a pulse width of the pulsed waveform is less than the RF repetition period;

acquiring an output RF signal from the DUT responsive to the input test RF signal;

down converting the output RF signal to an intermediate frequency (IF) signal;

sampling the IF signal using an analog to digital converter (ADC) having an ADC clock frequency;

measuring ADC samples of the IF signal; and reconstructing the test RF signal modulated with the repetitive complex waveform using the measured ADC samples.

2. The method of claim 1, wherein measuring the ADC samples comprises accumulating measured ADC samples measured during measurement periods substantially corresponding to consecutive on-pulses of the pulsed waveform.

3. The method of claim 2, wherein measuring the ADC samples further comprises concatenating a predetermined number of the measured ADC samples to create a time record.

4. The method of claim 2, wherein measuring the ADC samples further comprises discarding measured ADC samples measured during non-measurement periods substantially corresponding to off-pulses of the pulsed waveform, occurring between the consecutive on-pulses.

5. A method for measuring modulated radio frequency (RF) signals from a device under test (DUT), the method comprising:

inputting a test RF signal to the DUT, wherein the test RF signal is modulated with a repetitive complex waveform and a pulsed waveform, the repetitive complex waveform comprising a plurality of RF tones with an RF tone spacing $F_{Mod}$ and an RF repetition period $T_{Mod}$;

acquiring an output RF signal from the DUT responsive to the input test RF signal, wherein the output RF signal is modulated with the repetitive complex waveform, comprising the RF tone spacing $F_{Mod}$ and the RF repetition period $T_{Mod}$, and the pulsed waveform;

down converting the output RF signal to an intermediate frequency (IF) signal, wherein the IF signal is modulated with a repetitive complex waveform comprising a plurality IF tones with an IF tone spacing $F_{IF}$ and an IF repetition period $T_{IF}$, wherein the pulsed waveform of the test RF signal comprises on-pulses, each of which is a fraction of the IF repetition period $T_{IF}$, and off-pulses, each of which is approximately an integer multiple of the IF repetition period $T_{IF}$;

sampling the IF signal using an analog to digital converter (ADC) having an ADC clock frequency $F_{ADC}$, wherein the RF tone spacing $F_{Mod}$ is selected to equal a first fraction of the ADC clock frequency $F_{ADC}$, and wherein the IF tone spacing $F_{IF}$ is selected such that the plurality of RF tones are down converted to the plurality of IF tones which correspond to harmonics of a second fraction of the ADC clock frequency $F_{ADC}$, and the IF repetition period $T_{IF}$ equals an integer multiple of the RF repetition period $T_{Mod}$;

measuring ADC samples of the IF signal during at least measurement periods, which substantially correspond to the on-pulses of the pulsed waveform, respectively; and concatenating a predetermined number of the ADC samples measured during the measurement periods to create a time record.

6. The method of claim 5, wherein the time record has a length equal to the IF repetition period $T_{IF}$.

7. The method of claim 5, wherein the first fraction of the ADC clock frequency $F_{ADC}$ is N/M (N and M being positive integers), and the second fraction of the ADC clock frequency $F_{ADC}$ is $F_{ADC}$/M, such that the RF tone spacing $F_{Mod}$ is selected to equal the ADC clock frequency $F_{ADC}$ times (N/M), and wherein the plurality of IF tones correspond to harmonics of $F_{ADC}$/M, and the IF repetition period $T_{IF}$ equals N times the RF repetition period $T_{Mod}$.

8. The method of claim 5, further comprising:

when an RF bandwidth of the output RF signal is wider than an IF bandwidth of the IF signal, repeating acquisitions of the output RF signal to obtain multiple IF signals at the IF bandwidth, and stitching the multiple IF signals together to provide a stitched IF bandwidth corresponding to the RF bandwidth.

9. The method of claim 5, wherein each of the measurement periods equals the IF repetition period $T_{IF}$ divided by L (L being positive integers).

10. The method of claim 9, wherein L is a predetermined number of consecutive measurement periods that create the time record.

11. The method of claim 5, wherein ADC samples of the IF signal are also measured during non-measurement periods, which substantially correspond to the off-pulses of the pulsed waveform, respectively, the method further comprising:

discarding the ADC samples measured during the non-measurement period.

12. The method of claim 11, wherein each of the measurement periods equals the IF repetition period $T_{IF}$ divided by L, and each of the non-measurement periods, occurring between the measurement periods, equals the IF repetition period $T_{IF}$ multiplied by K (L and K being positive integers).

13. A system for measuring modulated radio frequency (RF) signals from a device under test (DUT), the system comprising:

a signal source configured to generate a test RF signal that is applied to the DUT, wherein the test RF signal is modulated with a repetitive complex waveform and a pulsed waveform, the repetitive complex waveform comprising a plurality of RF tones with a tone spacing $F_{Mod}$ and an RF repetition period $T_{Mod}$;

a local oscillator (LO) configured to generate an LO signal having an LO frequency;

a mixer configured to mix the LO signal with an output RF signal, received from the DUT in response to the applied test RF signal, and to output an intermediate frequency (IF) signal modulated with a repetitive complex waveform comprising a plurality of IF tones with a tone spacing $F_{IF}$ and an IF repetition period $T_{IF}$, wherein the pulsed waveform of the test RF signal comprises on-pulses, each of which is a fraction of the IF repetition period $T_{IF}$, and off-pulses, each of which is approximately an integer multiple of the IF repetition period $T_{IF}$;

an analog to digital converter (ADC) having an ADC clock frequency $F_{ADC}$ and configured to sample the IF signal from the mixer, wherein the RF tone spacing $F_{Mod}$ is selected to equal the ADC clock frequency $F_{ADC}$ multiplied by N/M, N and M being positive integers, and wherein the IF tone spacing $F_{IF}$ is selected such that the plurality of RF tones are down converted to the plurality IF tones which correspond to harmonics of the ADC clock frequency $F_{ADC}$ divided by M, and the IF repetition period $T_{IF}$ equals N times the RF repetition period $T_{Mod}$; and a processing unit programmed to measure ADC samples of the IF signal, and to accumulate measured ADC samples measured during measurement periods substantially corresponding to the on-pulses of the pulsed waveform, and to concatenate a predetermined number of the accumulated ADC samples to create a time record having a length equal to the IF repetition period $T_{IF}$.

14. The system of claim 13, wherein the processing unit is further programmed to discard measured ADC samples measured during non-measurement periods substantially corresponding to the off-pulses of the pulsed waveform.

15. The system of claim 14, wherein each of the measurement periods equals the IF repetition period $T_{IF}$ divided by L, and each of non-measurement periods equals the IF repetition period $T_{IF}$ multiplied by K (L and K being positive integers).

16. The system of claim 15, wherein L is a predetermined number of consecutive measurement periods that create the time record.

17. The system of claim 13, wherein the time record has a length equal to the IF repetition period $T_{IF}$.

18. The system of claim 13, wherein a first fraction of the ADC clock frequency $F_{ADC}$ is N/M (N and M being positive integers), and a second fraction of the ADC clock frequency $F_{ADC}$ is $F_{ADC}/M$, such that the RF tone spacing $F_{Mod}$ is selected to equal the ADC clock frequency $F_{ADC}$ times (N/M), and wherein the plurality of IF tones correspond to harmonics of $F_{ADC}/M$, and the IF repetition period $T_{IF}$ equals N times the RF repetition period $T_{Mod}$.

* * * * *

UNITED STATES PATENT AND TRADEMARK OFFICE
CERTIFICATE OF CORRECTION

| | | |
|---|---|---|
| PATENT NO. | : 11,255,900 B2 | Page 1 of 1 |
| APPLICATION NO. | : 17/006038 | |
| DATED | : February 22, 2022 | |
| INVENTOR(S) | : Jean-Pierre Teyssier | |

It is certified that error appears in the above-identified patent and that said Letters Patent is hereby corrected as shown below:

In the Claims

Column 9, Line 65, and Column 11, Line 19, after "plurality", insert --of--.

Signed and Sealed this
Second Day of August, 2022

Katherine Kelly Vidal
*Director of the United States Patent and Trademark Office*